(12) United States Patent
Maindron et al.

(10) Patent No.: US 8,227,800 B2
(45) Date of Patent: Jul. 24, 2012

(54) DEVICE COMPRISING AN ORGANIC COMPONENT AND AN ENCAPSULATION LAYER WITH A MOISTURE-REACTIVE MATERIAL

(75) Inventors: Tony Maindron, Grenoble (FR); David Vaufrey, Grenoble (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 252 days.

(21) Appl. No.: 12/746,042

(22) PCT Filed: Dec. 8, 2008

(86) PCT No.: PCT/FR2008/001703
§ 371 (c)(1),
(2), (4) Date: Jun. 3, 2010

(87) PCT Pub. No.: WO2009/101299
PCT Pub. Date: Aug. 20, 2009

(65) Prior Publication Data
US 2010/0276818 A1     Nov. 4, 2010

(30) Foreign Application Priority Data
Dec. 14, 2007   (FR) .................................... 07 08743

(51) Int. Cl.
*H01L 35/24* (2006.01)
(52) U.S. Cl. .................... 257/40; 257/433; 257/E51.001
(58) Field of Classification Search ................ 257/40, 257/E51.001, 433
See application file for complete search history.

(56) References Cited

U.S. PATENT DOCUMENTS

| 2006/0077651 A1 | 4/2006 | Yamazaki et al. |
| 2006/0087230 A1 | 4/2006 | Ghosh et al. |
| 2006/0093795 A1 | 5/2006 | Wang et al. |
| 2006/0170341 A1 | 8/2006 | Su et al. |

FOREIGN PATENT DOCUMENTS

| DE | 10 2005 005 579 A1 | 8/2006 |
| EP | 1 164 644 A2 | 12/2001 |
| WO | WO 2006/082111 | 8/2006 |

OTHER PUBLICATIONS

French Search Report issued in Application No. 0708743; Jul. 31, 2008 (With Translation).
International Search Report issued in Application No. PCT/FR2008/001703; Mailed on Jul. 7, 2009 (With Translation).

*Primary Examiner* — Anthony Ho
(74) *Attorney, Agent, or Firm* — Oliff & Berridge, PLC

(57) ABSTRACT

The device includes at least one optoelectronic component positioned on a substrate and at least one transparent face. The component is covered by a packaging layer which includes at least one barrier layer and a moisture-reactive layer. The reactive layer includes a moisture-reactive material chosen from alkaline-earth metals, alkali metals and organo-metallic derivatives. The material can be positioned in the moisture-reactive layer in the form of a continuous layer or in the form of a plurality of nodules dispersed in an organic matrix.

11 Claims, 1 Drawing Sheet

DEVICE COMPRISING AN ORGANIC COMPONENT AND AN ENCAPSULATION LAYER WITH A MOISTURE-REACTIVE MATERIAL

BACKGROUND OF THE INVENTION

The invention relates to a device comprising at least one organic component positioned on a substrate, the component being covered by a packaging layer, comprising at least one moisture-reactive layer, said reactive layer comprising nodules of a moisture-reactive material dispersed in a matrix.

STATE OF THE ART

Optoelectronic organic components, for example organic light-emitting diodes, are increasingly used and the number of their applications is growing incessantly. However, to meet the requirements of these new applications, it is becoming necessary to produce smaller and smaller transparent protection means that are resistant to the outside environment. Indeed, if organic light-emitting diodes are not protected or if their protection is not perfectly suited to the external conditions, the diodes deteriorate. Deterioration of the diodes is caused essentially by the moisture in the outside atmosphere that passes through the packaging means and reacts with the materials constituting the diode.

In conventional manner, as illustrated in FIG. 1, the diodes are encapsulated in a closed cavity 8 delineated between a glass cover 9 and a substrate 2 on which diode 1 is integrated. This cavity is bounded by a bead of adhesive 10 that forms a peripheral seal. However this bead of adhesive 10 presents limited performances as regards its imperviousness to moisture. A solid getter material 11 is then placed in the cavity to react with the moisture that passes through the walls and thereby preserve the diode. However, this type of packaging is only able to be used with rigid substrates and/or with cavities that are sufficiently large to integrate a getter material next to the diode. This type of integration is therefore difficult to industrialize for common products with a low cost price.

It is also known to use monolithic packaging, i.e. packaging formed by one or more layers having excellent barrier qualities against moisture, for example $Al_2O_3$/polymer/$Al_2O_3$ or $SiO_x$/SiN/$SiO_x$ stacks. However, the thickness of the packaging layer being limited, the imperviousness of the packaging layer does not enable a sufficient strength to be ensured with time.

OBJECT OF THE INVENTION

The object of the invention is to provide a device having a packaging layer that is easy to implement and that provides enhanced protection of an opto-electronic organic component against the moisture of the outside atmosphere.

According to the invention, this object is achieved by the appended claims and more particularly by the fact that said matrix being organic, said moisture-reactive material is chosen from alkaline-earth and alkali materials, said organic matrix being chosen from naphthylphenylbiphenyl (BPhen) based materials, 8-hydroxyquinoline based materials, Spiro TAD based materials, Spiro TTB based materials, Spiro-NPB based materials, Spiro-TPD based materials, TMM4 based materials, SEB010 based materials and BCP based materials.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PREFERRED EMBODIMENTS OF THE INVENTION

Figure 1:
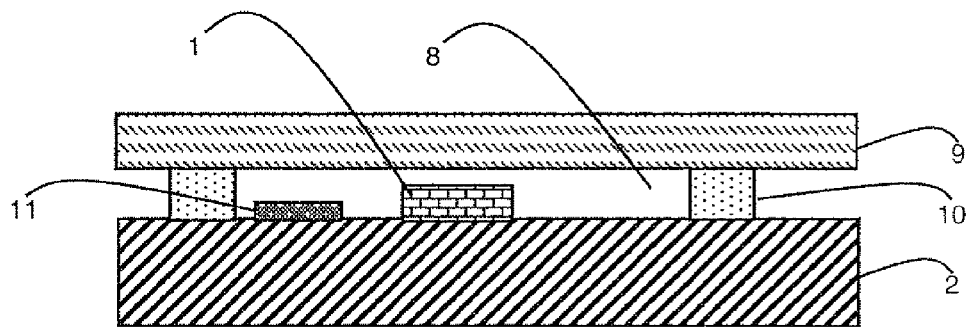
FIG. 1 illustrates a device according to the prior art in cross-section.
Figure 2:
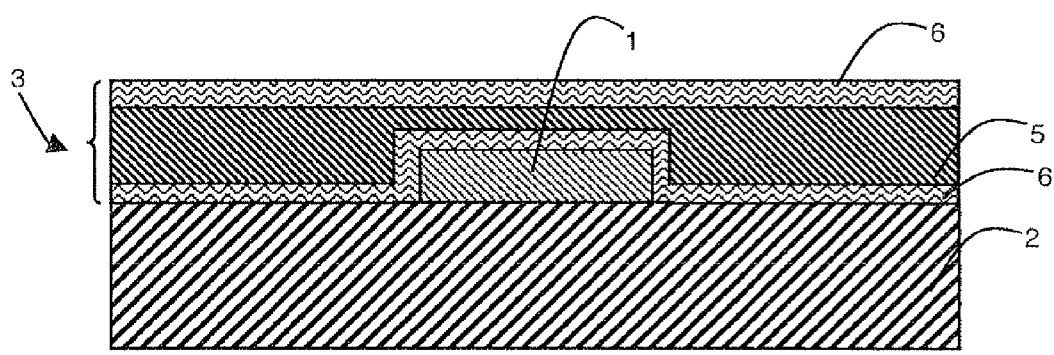
FIGS. 2 and 3 represent two particular embodiments of a device according to the invention in cross-section.

As illustrated in FIG. 2, at least one organic component 1 is positioned on a substrate 2 to form all or part of a device. Organic component 1 can be a light emitter and/or a light receiver, for example an organic light-emitting diode or a photovoltaic cell. Organic component 1 can also be an organic transistor. Substrate 2 can be a rigid substrate for example made from silicon or glass, or a flexible substrate for example made from polymer material, for example PET (PolyEthylene Terephtalate) or PEN (PolyEthylene Naphtalene). The device comprises at least one transparent face enabling the work wavelength of optoelectronic organic component 1 to be transmitted if the component is a light-emitting and/or light-receiving component.

Organic component 1, positioned on substrate 2, is covered by a packaging layer 3 to protect it against the moisture of the outside environment. Packaging layer 3 comprises a continuous moisture-reactive layer 5, itself comprising a moisture-reactive material. Packaging layer 3 also comprises a barrier material layer 6 that presents a low permeability to the moisture of the outside environment.

In the particular embodiment illustrated in FIG. 2, moisture-reactive layer 5 is formed by a continuous film of moisture-reactive material on which barrier layer 6 is deposited.

Figure 3:
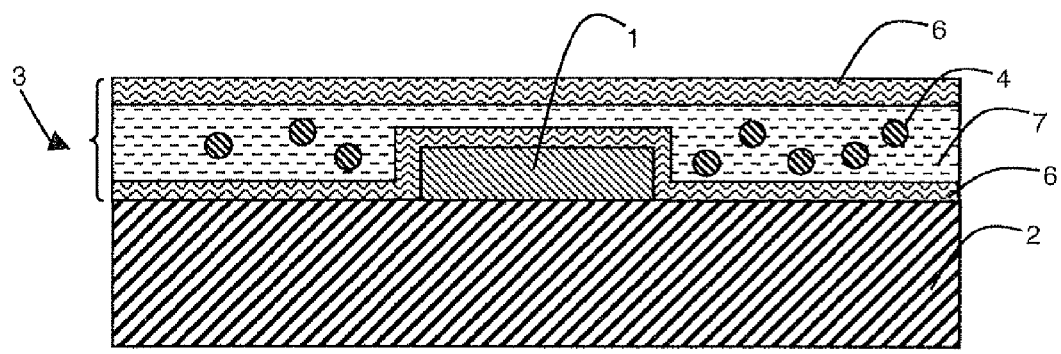

In a second embodiment illustrated in FIG. 3, moisture-reactive layer 5 is formed by a plurality of nodules 4 of moisture-reactive material dispersed in an organic matrix 7.

The moisture-reactive material is for example a material chosen from alkaline elements, alkaline-earth elements or an alloy based on one of these materials. The reactive material is preferably made from calcium Ca, caesium Ce or barium Ba, deposited by physical vapor deposition. However, the moisture-reactive material can be an organo-metallic derivative, for example AlQ3 (tris(8-hydroxyquinolinato)aluminum), GaQ3 or InQ3.

If layer 5 is formed by a continuous film made from an alkaline or alkaline-earth element, its thickness is typically about a few atomic monolayers, which enables it to remain transparent. The thickness of reactive layer 5 is advantageously less than 5 nm. A larger thickness can be used if the packaging layer can be substantially opaque, for example in the case where an organic light-emitting diode emits a light radiation through the substrate (bottom emission) or if the component is an organic transistor. Reactive layer 5 can also be made from AlQ3 typically having a thickness comprised between 50 and 100 nm.

If layer 5 is formed by an organic matrix 7 comprising nodules of moisture-reactive material 4, organic matrix 7 is chosen from transparent materials in the work wavelength of component 1, if a transparent layer 5 is to be obtained.

Advantageously, organic matrix 7 is chosen from BPhen (4,7-diphenyl-1,10-phenanthroline) based materials, 8-hydroxyquinoline based materials, Spiro-TAD (2,2',7,7'-Tetrakis-(di-phenylamino)-9,9'-spirobifluorene) based materials, Spiro-TTB (2,2',7,7'-Tetrakis-(N,N'-di-p-methylphenylamino)-9,9'-spirobifluorene) based materials, Spiro-NPB (N,N'-Diphenyl-N,N'-bis(1-naphthyl)-1,1'-biphenyl-4,4'-diamine) based materials, Spiro-TPD (2,2',7,7'Tetra-(m-tolyl-phenylamino)-9,9'-spirobifluorene) based materials, TMM4 based materials, SEB010 based materials, and BCP based materials. The thickness of the organic matrix is typically less than or equal to 100 nm if this layer is to remain transparent. However, larger thicknesses can be integrated if transparency is not required. These materials are advantageous to use if they are already integrated in the diode fabrication process as active organic layers. They can in particular be deposited in the same deposition chamber as the diode itself.

Also in advantageous manner, organic matrix 7 contains less than 2% by weight of moisture-reactive material to remain transparent. For example purposes, moisture-reactive layer 5 can be formed by a layer of BPhen (4,7-diphenyl-1,10-phenanthroline) comprising 2% of calcium.

Preferably the thickness/moisture-reactive material concentration pair of reactive layer 5 is defined such that reactive layer 5 is transparent.

As illustrated in FIGS. 2 and 3, a barrier layer 6 is positioned on reactive layer 5 to delay contact between the moisture of the outside environment and reactive layer 5. Advantageously, packaging layer 3 comprises another barrier layer 6 which separates reactive layer 5 from optoelectronic organic component 1.

When barrier layer 6 is deposited on reactive layer 5, this reactive layer and in particular the material of the organic matrix has to be compatible with such a deposition. Organic materials whose glass transition temperature is sufficiently high, for example more than 100° C., will then preferably be selected to avoid possible crystallization problems. As Bphen has a low vitreous transition temperature, advantageously it will not be used.

Packaging layer 3 is preferably formed by an alternation of barrier layers 6 and reactive layers 5, packaging layer 3 then beginning and ending with a barrier layer 6.

Barrier layer 6 is advantageously made from alumina ($Al_2O_3$) deposited by Atomic Layer Deposition (ALD). However, barrier layer 6 can for example be made from silicon oxide ($SiO_2$), stoichiometric or not silicon nitride ($Si_xN_y$), or from silicon oxynitride ($SiO_xN_y$) and be deposited by plasma enhanced chemical vapor deposition or by atomic layer deposition. The thickness of barrier layer 6 is typically comprised between 5 and 100 nm.

If light transmission takes place through packaging layer 3, the thickness of the different layers forming the packaging layer is then chosen for the latter to be transparent.

If reactive layer 5 is formed by continuous films of material 4, the total thickness of reactive layer 5 is advantageously less than or equal to 5 nm for calcium layers 5 and less than or equal to 100 nm for layers 5 of AIQ3. Furthermore, if reactive layer 5 is formed by organic matrix films with material nodules 4, this total thickness is advantageously less than 100 nm.

Advantageously, if the substrate is made from plastic or polymer, an additional moisture-reactive layer can be deposited between component 1 and substrate 2.

Nodules 4 of reactive material can also be positioned in the substrate if the latter does not present sufficient intrinsic characteristics to form a barrier against moisture.

The invention claimed is:

1. A device comprising:
a substrate,
an organic component positioned on the substrate,
a packaging layer covering the component, the packaging layer comprising:
a moisture-reactive layer wherein nodules of a moisture-reactive material chosen from alkaline-earth and alkali materials are dispersed in an organic matrix chosen from naphthylphenylbiphenyl based materials, 8-hydroxyquinoline based materials, Spiro TAD based materials, Spiro TTB based materials, Spiro-NPB based materials, Spiro-TPD based materials, TMM4 based materials, SEB010 based materials and BCP based materials.

2. Device according to claim 1, wherein the moisture-reactive material is chosen from calcium, caesium and barium.

3. Device according to claim 2, wherein the moisture-reactive material is calcium and the organic matrix is a naphthylphenylbiphenyl based material.

4. Device according to claim 1, wherein the moisture-reactive layer is formed by a continuous film of said moisture-reactive material.

5. Device according to claim 1, comprising at least one barrier layer.

6. Device according to claim 5, wherein a barrier layer is positioned above the reactive layer.

7. Device according to claim 5, wherein a barrier layer is positioned between the reactive layer and component.

8. Device according to claim 5, wherein the packaging layer is formed by an alternation of barrier layers and reactive layers.

9. Device according to claim 1, wherein the substrate is made from polymer material.

10. Device according to claim 1, wherein an additional moisture-reactive layer is positioned between the component and substrate.

11. Device according to claim 1, wherein the organic component is a light-emitting diode, a photovoltaic cell or an organic transistor.

* * * * *